US010798839B2

(12) United States Patent
Gao et al.

(10) Patent No.: US 10,798,839 B2
(45) Date of Patent: Oct. 6, 2020

(54) THERMAL MANAGEMENT CAGE FOR A SOLID STATE DRIVE

(71) Applicant: Cisco Technology, Inc., San Jose, CA (US)

(72) Inventors: Le Gao, Shanghai (CN); Yang Sun, Hangzhou (CN); Na Feng, Shanghai (CN); Yepeng Chen, Shanghai (CN)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 16/274,780

(22) Filed: Feb. 13, 2019

(65) Prior Publication Data

US 2020/0260602 A1 Aug. 13, 2020

(51) Int. Cl.
  *H05K 5/02* (2006.01)
  *G06F 1/20* (2006.01)
  *G06F 1/18* (2006.01)
  *H05K 7/20* (2006.01)

(52) U.S. Cl.
  CPC ............. *H05K 5/0256* (2013.01); *G06F 1/18* (2013.01); *G06F 1/20* (2013.01); *H05K 7/20136* (2013.01); *H05K 7/20418* (2013.01)

(58) Field of Classification Search
  CPC .......... G06F 1/20; G06F 1/187; G06F 1/1656; G06F 1/203; G06F 1/183; G06F 1/18; G11B 33/142; G11B 33/1426; G11B 33/1406; G11B 33/14; G11B 33/144; G11B 33/1413; H05K 7/20136; H05K 7/20718; H05K 7/20418; H05K 5/0256
  See application file for complete search history.

(56) References Cited

U.S. PATENT DOCUMENTS

| 4,027,206 | A | * | 5/1977 | Lee | H05K 7/20909 361/697 |
| 5,243,493 | A | * | 9/1993 | Jeng | H05K 7/20127 361/679.54 |
| 5,694,290 | A | * | 12/1997 | Chang | G11B 33/025 361/679.31 |
| 6,247,944 | B1 | * | 6/2001 | Bolognia | G06F 1/184 439/157 |
| 6,392,884 | B1 | * | 5/2002 | Chou | G06F 1/184 360/98.01 |
| 6,442,035 | B1 | * | 8/2002 | Perry | H05K 7/1425 206/706 |
| 6,637,719 | B2 | * | 10/2003 | Jiang | G06F 1/184 248/682 |
| 8,971,036 | B1 | * | 3/2015 | Lau | G06F 1/20 361/679.34 |
| 9,408,328 | B2 | * | 8/2016 | Nigen | H01L 23/3735 |
| 9,648,730 | B2 | * | 5/2017 | Harvilchuck | G06F 1/20 |
| 9,880,594 | B2 | | 1/2018 | Mataya et al. | |
| 10,085,364 | B2 | | 9/2018 | Voss | |

(Continued)

*Primary Examiner* — Adam B Dravininkas
(74) *Attorney, Agent, or Firm* — Edell, Shapiro & Finnan, LLC (57) ABSTRACT

A solid state drive (SSD) device includes a cage with a top wall and a bottom wall spaced a distance from the top wall so as to define a cage interior between the top and bottom walls. In addition, at least 10% of an area along a side of the cage is open to the cage interior to permit airflow through the side of the cage. At least one printed circuit board (PCB), which includes at least one integrated circuit component, is also provided within the cage interior.

8 Claims, 11 Drawing Sheets

(56) References Cited

U.S. PATENT DOCUMENTS

| | | | |
|---|---|---|---|
| 10,186,471 B2 | 1/2019 | Chen | |
| 2002/0139467 A1* | 10/2002 | Tomioka | H05K 1/141 |
| | | | 156/92 |
| 2005/0114876 A1* | 5/2005 | Atarashi | G11B 33/1406 |
| | | | 720/649 |
| 2014/0036435 A1* | 2/2014 | Kim | G06F 1/20 |
| | | | 361/679.33 |
| 2016/0270265 A1* | 9/2016 | Yoshinaga | H05K 7/20727 |
| 2018/0049349 A1* | 2/2018 | Voss | H01L 23/367 |
| 2018/0151469 A1* | 5/2018 | Chen | G11C 5/00 |

* cited by examiner

THERMAL MANAGEMENT CAGE FOR A SOLID STATE DRIVE

TECHNICAL FIELD

The present disclosure relates to solid state drives and enclosures that provide protection for the solid state drives.

BACKGROUND

High density storage capabilities for servers are becoming increasingly important. In addition, the use of solid state drive (SSD) technology is becoming the mainstream type of storage for the server market due to the faster read-write speeds associated with SSD devices in relation to other storage devices (e.g., hard disk drive (HDD) devices). However, as the density and power of servers has grown, so have the issues associated with controlling dissipation of heat that is generated by components of the SSD devices.

The conventional cage design for a SSD device can block airflow around the components and increase system impedance when the SSD array pitch becomes tight, and such cage design can further have a negative impact on controlling temperature and thermal management of an SSD device. This can also be compounded when the number and spatial density of SSD devices increases within a server. This can lead to a negative impact on performance of the server.

DESCRIPTION OF EXAMPLE EMBODIMENTS

Overview

A solid state drive (SSD) device is provided that comprises a cage and at least one printed circuit board (PCB) provided within a cage interior, where the PCB includes one or more integrated circuit components. The cage comprises a top wall and a bottom wall spaced a distance from the top wall so as to define the cage interior between the top and bottom walls, where at least 10% of an area along a side of the cage is open to the cage interior to permit airflow through the side of the cage.

In addition, a server system is provided that comprises a server comprising a processor enclosed within a housing, and a plurality of interface ports to connect with external hardware components, and a solid state drive (SSD) device connectable with an interface port of the server, where the SSD device has features as described herein.

Further, a cage for a solid state drive (SSD) device is described, where the cage comprises a top wall and a bottom wall spaced a distance from the top wall so as to define a cage interior between the top and bottom walls, where an at least 10% of an area along a side of the cage is open to the cage interior to permit airflow through the side of the cage. The cage interior is dimensioned to receive and retain at least one printed circuit board (PCB) that includes one or more integrated circuit components.

Example Embodiments

Figure 1A:
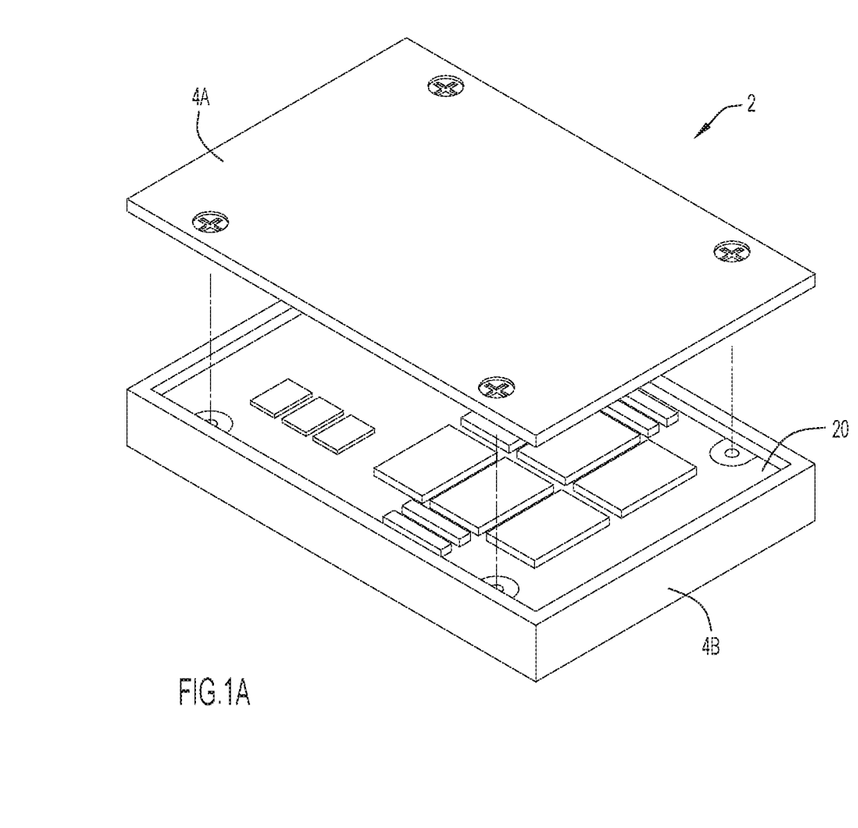
FIGS. 1A and 1B depict an example embodiment of a conventional solid state drive (SSD) device with a cage that entirely encloses integrated circuit components of the device.
Figure 1B:
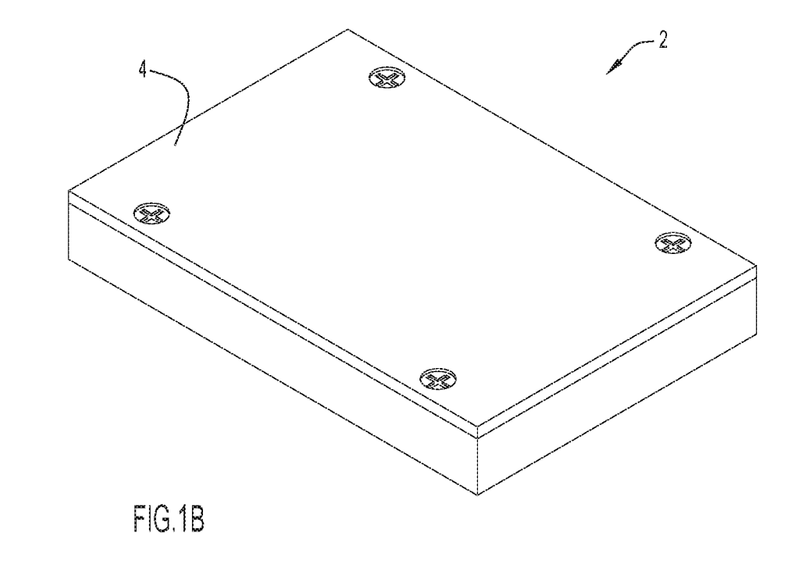

Referring to FIGS. 1A and 1B, a typical solid state drive (SSD) device 2 typically includes a housing or cage 4 constructed of metal or other suitable material and that defines an enclosure for one or more printed circuit boards (PCBs). A typical PCB 20 provided in a SSD device includes integrated circuit components such as nonvolatile flash memory cells (e.g., formed with electronic circuitry such as transistors, diodes, resistors, capacitors, etc.) and a processor for control of read and write operations in relation to the SSD device. A typical cage 4 includes two half shell components 4A, 4B that combine to completely surround and enclose each PCB 20 disposed within the cage 4.

Figure 2:
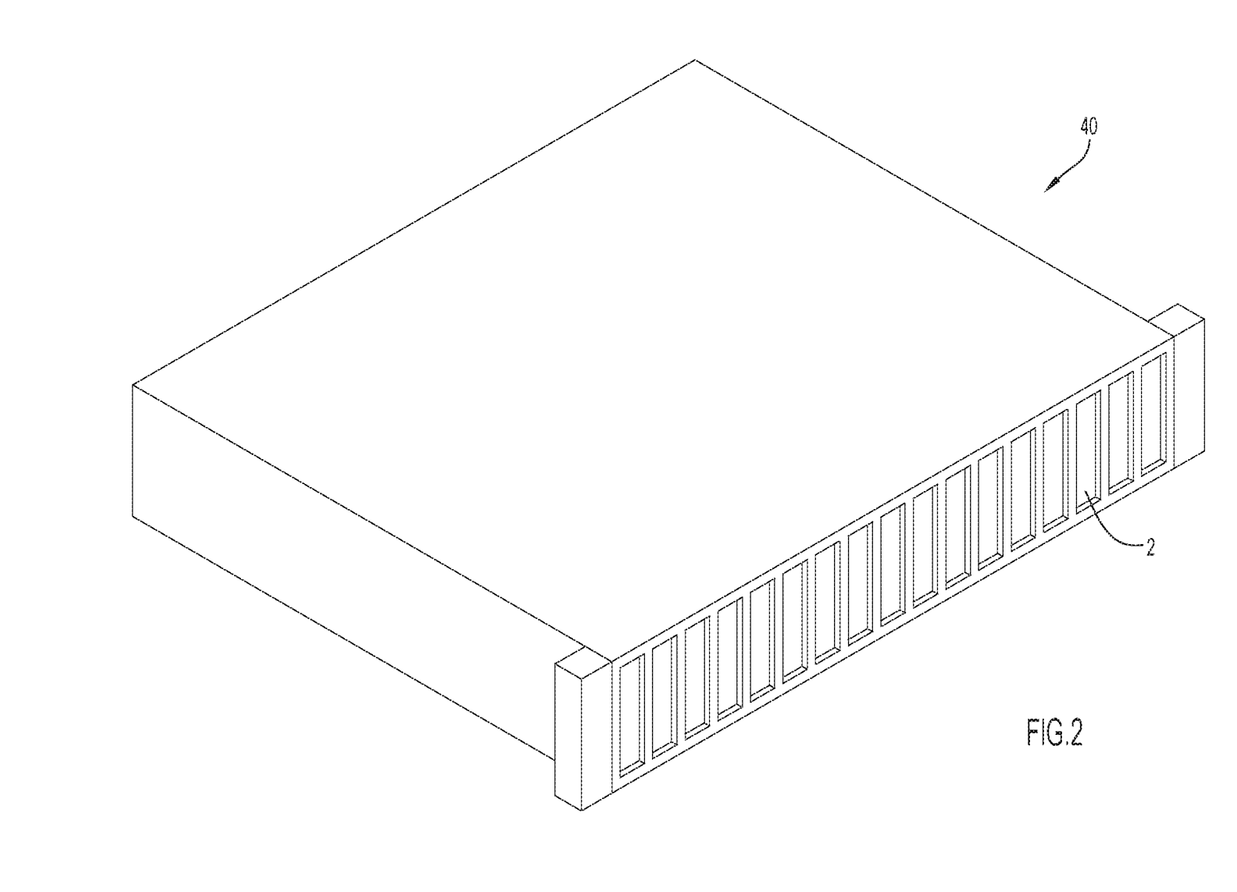
FIG. 2 depicts an example embodiment of a conventional server including a plurality of SSD devices disposed within connection/memory slots of the server.

Referring to FIG. 2, an example embodiment of a server 40 is depicted, where the server 40 includes a housing having a plurality of slots that receive and connect with external electronic/hardware components, such as SSD device 2. The server 40 can be of a conventional or other suitable type and include conventional components enclosed within the server housing including a controller/processor to control server operations, and one or more host interface connectors or ports to facilitate connection with external components such as the SSD device 2. For example, the server 40 can include a series of interface ports or slots with suitable hardware to facilitate connection with a plurality or an array of SSD devices 2 (as shown in FIG. 2).

While SSD devices provide faster I/O operations in relation to, e.g., hard disk drive (HDD) devices), these devices can also generate considerable heat during operation (e.g., depending upon operating voltages associated with data storage). The closed cage design for the SSD device (e.g., as shown in the example embodiment of FIGS. 1A and 1B) is important to provide protection to the integrated circuit components disposed on one or more PCBs provided within the housing walls of the cage. However, this closed cage design can inhibit adequate air flow and heat dissipation from the SSD device. In addition, with the increasing power and density of components provided within servers, the cage design of the SSD device can result in a blocking of air flow and an increase in system impedance within the server (particularly when an SSD array pitch becomes very tight within the server). Such blocking of airflow can result in an increase in hot air flow and temperature to the rear nodes of the server (often where high power integrated circuit chips are located, such as CPU, GPU and FPGA circuits), where the increase in temperature can lead to a decrease in server performance during system operation.

In accordance with embodiments described herein, thermal performance can be significantly enhanced by providing a cage configuration which freely allows airflow through a SSD device. The cage configuration described herein provides protection of the integrated circuit components housed therein while also providing suitable apertures or openings within the cage to allow free movement of air to flow through the cage during system operation (particularly when the SSD device is installed in a server having a high concentration of components closely arranged within the server).

Figure 3A:
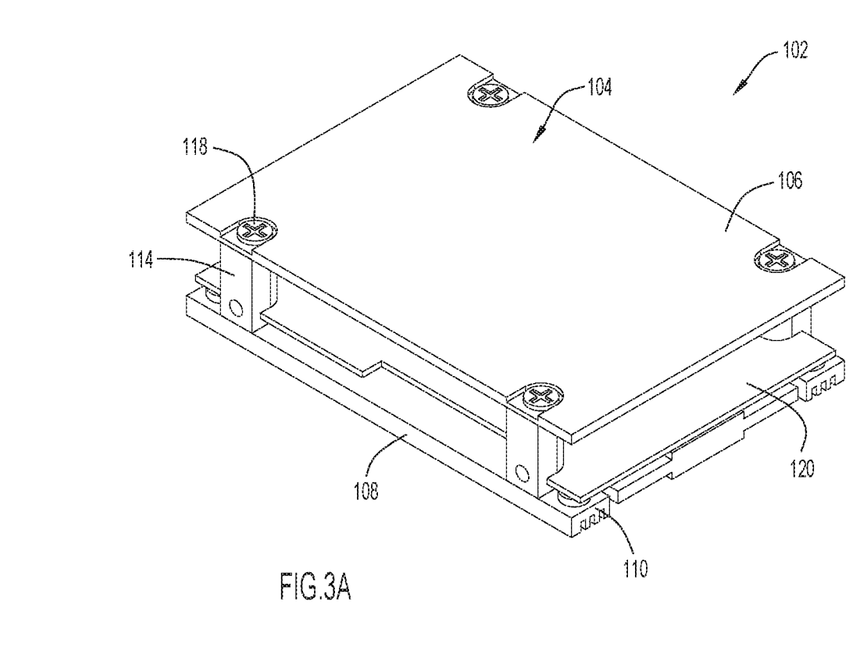
FIG. 3A depicts an example embodiment of a SSD device including a cage which provided enhanced thermal management for the integrated circuit components of the SSD device in accordance with the present invention.
Figure 3B:
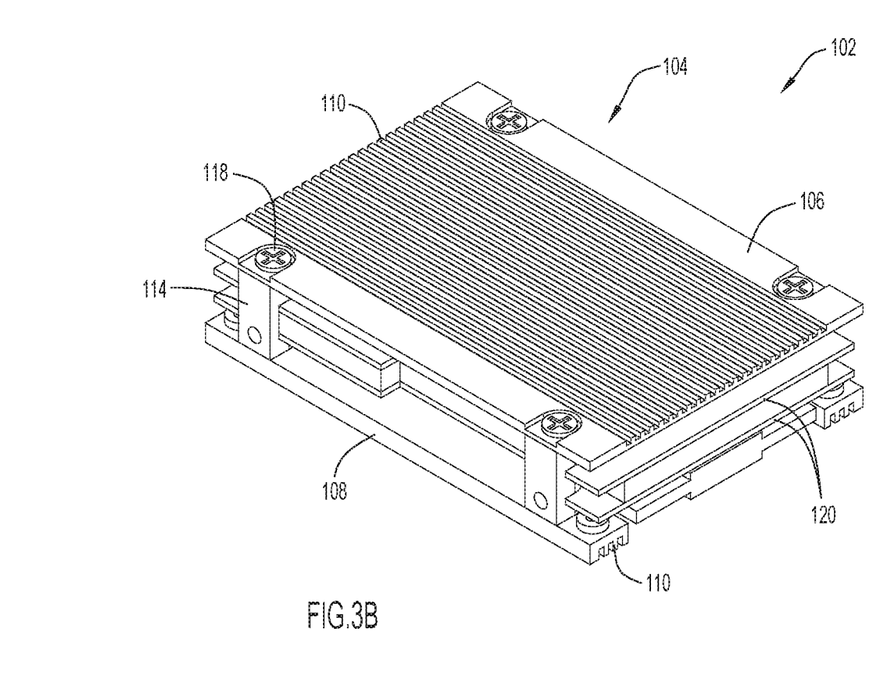
FIG. 3B depicts another example embodiment of a SSD device including a cage which provided enhanced thermal management for the integrated circuit components of the SSD device in accordance with the present invention.
Figure 4:
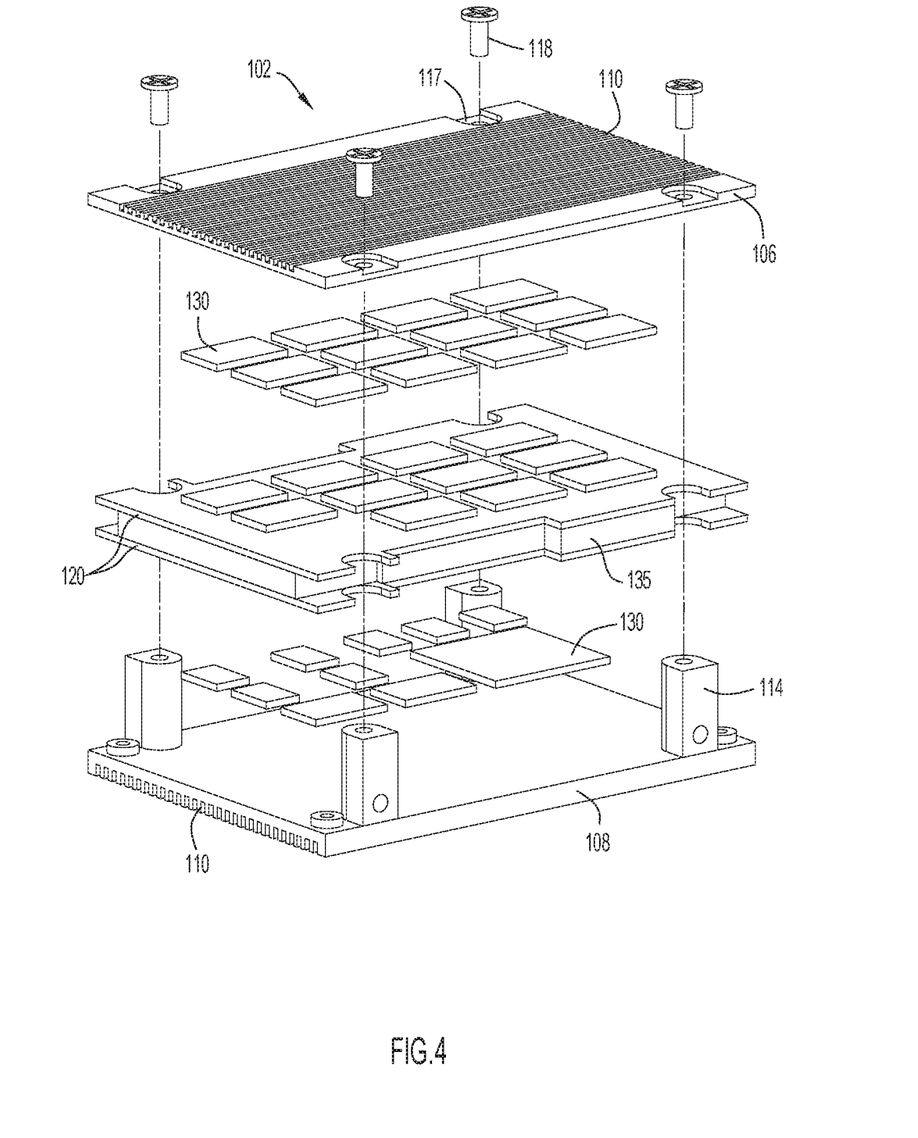
FIG. 4 depicts an exploded view of the SSD device of FIG. 3B.

Referring to FIGS. 3A, 3B and 4, a SSD device 102 includes a cage 104 and integrated circuit components disposed on one or more printed circuit boards (PCBs) 120 within the cage 104 (e.g., one or a plurality of PCBs are provided within the cage interior). The cage 104 has a generally rectangular configuration and includes a first (e.g., top) cage wall or plate 106 and a second (e.g., bottom) cage wall or plate 108, where the cage plates are separated from each other by a suitable distance to define a gap between the plates. The gap between the plates 106, 108 provides a partial enclosure or housing for integrated circuit components of the SSD device 102 that are provided on one or more PCBs 120. The cage 104 can be constructed of any suitable material such as a metal or metal alloy. Some examples of metals that can be used to form a plate and/or other components of the cage (e.g., the pillars as described herein) include, without limitation, steel, aluminum, and copper. For example, a metal such as copper or aluminum may be desired for certain scenarios due to the higher thermal conductivities associated with such metals (and thus the ability to transfer heat from within the cage and away from integrated circuit components of the SSD device). Alternatively, components of the cage can be formed of a plastic or other suitable material having sufficient hardness and rigidity to facilitate protection and mounting of PCBs within the cage. The first and second plates can further have any suitable length, width and thickness dimensions suitable for defining a three dimensional footprint of the SSD device that has a suitable form factor so as to be configured for use with a conventional server type or other computing component. For example, SSD devices described herein can have the same or similar dimensions as conventional SSD devices meeting conventional HDD dimensions for HDD form factors such as 2.5 inch, 3.5 inch, 5.25 inch, etc., and also with HDD form factor heights varying from 5 mm to 15 mm (e.g., 7 mm or 15 mm).

The cage 104 also includes at least one pillar that connects the top wall with the bottom wall, since the cage is free of any sidewall extending between the top and bottom walls. For example, a plurality of plate support structures or pillars 114 that extend between and connect with the plates 106, 108 at their facing surfaces (i.e., the surfaces of the plates that define an interior portion of the SSD device 102). In the embodiments depicted in FIGS. 3A, 3B and 4, the cage 104 includes four pillars 114 with each pillar 114 being located at or proximate a corresponding corner for each plate 106, 108 (i.e., at or proximate the intersection of corresponding lengthwise and widthwise edges of the plate, where each pillar is located at a lengthwise end of the cage). The pillars have a generally rectangular configuration. In other embodiments, any number of pillars (one, two or more) can be provided having any suitable geometric configurations (e.g., cylindrical, rectangular, triangular, etc.) and lengthwise and transverse dimensions as well as being placed at any number of different locations along each of the first and second plates in order to connect the plates at a suitable distance from each other. In the embodiments depicted in FIGS. 3A, 3B and 4, each pillar 114 is connected at one end to the interior surface of the second (e.g., lower) plate 108 as a single integral unit (e.g., the pillars 114 and plate 108 are molded or formed as a single, integral unit). The other end of each pillar 114 connects with the first (e.g., top) plate 106 via a suitable fastener, such as a threaded fastener or screw 118 that extends through a bore 117 at a fastening location of the first plate 106 to connect with a corresponding threaded bore formed in the end of the pillar 114 (see FIG. 4). Any other suitable fastener can also be utilized that facilitates selective connection and removal of the first plate 106 from each of the pillars 114 (e.g., to permit access to a PCB within the cage 104). The pillars can also be removably secured to each plate via suitable securing structure (e.g., threaded fasteners).

Figure 5:
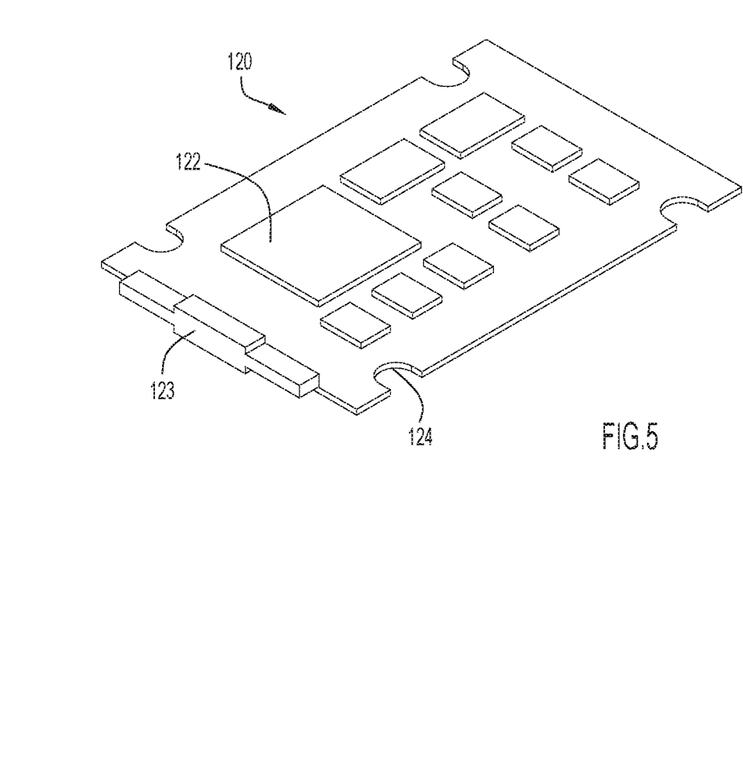
FIG. 5 depicts an example embodiment of a printed circuit board for a SSD device.

The gap or spacing between the plates (which is defined by the length of the one or more pillars provided to connect the plates) defines an interior of the cage that can be configured to facilitate placement of any number of PCBs including integrated circuit components between the plates and thus within the cage. In the embodiment of FIG. 3A, a single PCB is provided within the cage 104 for the SSD device 102. In the embodiment of FIG. 3B, two PCBs 120 are provided within the cage 104 of the SSD device 102. A typical PCB 120 for a SSD device is depicted in FIG. 5 and includes conventional integrated circuit and or other SSD components (shown generally as components 122) such as one or more memory chips (e.g., flash memory), and a controller/processor to control read and write operations to the memory chips on the PCB. A typical PCB 120 further includes a suitable edge connector structure (shown generally as component 123, e.g., an interface structure such as a Serial ATA) to facilitate a host interface connection between the SSD device and the server when the SSD device is inserted, e.g., at a rear end of the SSD device, into a slot of the server. The PCB 120 includes one or more notches 124 along its edge and at locations that correspond with the locations of pillars 114 of the cage 104. When the PCB 120 is placed within the cage interior, each notch 124 of the PCT 120 aligns and engages with a portion of a corresponding pillar 114 to help secure the PCB within the cage 104.

The SSD device 102 further includes a thermal interference material (TIM) layer disposed between the SSD components 122 of each PCB 120 and the interior surface of the adjacent plate 106/108. The TIM layer can be provided in layer segments or pads 130 that are suitably dimensioned to cover corresponding SSD components 122 and further have a suitable thickness to facilitate adequate heat transfer between the components and the SSD cage 104. Any suitable TIM material can be provided having adequate thermal conductivities including, without limitation, graphite, silicone and/or other polymer materials. The TIM materials can also have a suitably low elastic modulus and suitable deformability to further provide a cushioning barrier for the component within the cage. When two or more PCBs 120 are provided in the SSD device 102 (e.g., as depicted in FIG. 4), a further barrier 135 (e.g., an insulating barrier) can be provided between neighboring PCBs 120.

In certain embodiments, fins are disposed on an exterior surface of at least one of the top wall and the bottom wall of the cage. For example, one or both of the first and second plates 106, 108 of the SSD cage 104 can include a series of fins 110 disposed along the exterior surface of the plate so as to define a fluted or undulating surface (i.e., a surface including a series of ridges with adjacent grooves between the ridges). For example, the SSD device of FIG. 3A includes fins 110 on the exterior surface of only the first plate 106, while the SSD device of FIG. 3B includes fins 110 on the exterior surface of both the first and second plates 106, 108. In other embodiments, the cage can be constructed such that neither plate includes fins. The fins can be provided, e.g., in certain server scenarios in which it is desired to enhance air flow around the SSD device, enhance heat dissipation and also thermal regulation within the server.

The cage configurations as depicted in FIGS. 3A, 3B and 4 facilitates effective airflow through the cage during operation of the SSD device 102 within a server (such as server 40). In particular, the SSD cage is free of any sidewalls that are disposed between the top and bottom walls. The absence of sidewalls for the SSD cage allows the free flow of air into and through the cage 104 as well as around the integrated circuit components disposed on the one or more PCBs 120 within the cage 104. By providing only two plates (first and second plates 106, 108), which serve as top and bottom walls of the cage 104, the cage is free of any sidewall extending between the top and bottom walls for the entire length or entire width of the cage. This configuration provides for effective airflow through and thermal regulation of the SSD device during SSD operation, which also assists with overall thermal regulation of the server device during server operation. The fins disposed on one or both exterior surfaces of the top and bottom cage plates can also further enhance thermal regulation of the SSD device during operation.

Other SSD cage embodiments can also be provided to enhance thermal regulation where the SSD cage is free of one or more sidewalls, or some portion of one or more sidewalls to enable free flow of air through the opening(s). For example, a SSD cage can include a combination of a top wall, a bottom wall, at least one sidewall that extends between the top and bottom walls and that further extends the length of the SSD cage and/or at least one sidewall that extends the width of the SSD cage. In one embodiment, a SSD cage includes top and bottom walls, two sidewalls that extend between the top and bottom walls and also the length of the SSD cage, and one sidewall that extends between the top and bottom walls and also the width and at one end of the SSD cage, such that the SSD cage is free of any sidewall (i.e., the SSD cage is open) at the other end of the SSD cage. In embodiments in which one or more sidewalls are provided in combination with top and bottom walls for the SSD cage, pillars need not be required to support and provide the separation between top and bottom walls (and define the cage interior) since the one or more sidewalls can effectively provide the same or similar support.

In further embodiments, the SSD cage can include sidewall portions that do not entirely enclose the cage interior along one or more sides of the cage. One or more sidewalls can be provided along with top and bottom walls, where at least one sidewall has a portion removed such that the sidewall does not cover the entire side of the SSD cage but instead provides one or more openings at the sidewall for airflow. For example, a sidewall can extend along a portion but not the entire side of the SSD cage such that this side of the SSD cage is open to the cage interior. In another example, one or more sidewalls extending between the top and bottom walls, where at least one sidewall includes a plurality of perforations or apertures that extend through the sidewalls to permit access to airflow through the sidewall and into and through the cage interior. The apertures can be of any suitable sizes and shapes (e.g., circular, oval, rectangular, triangular, etc.) and located in any number of arrays or patterns that enhance airflow through the sidewall. In selected embodiments, at least about 10%, at least about 20%, at least about 30%, at least about 40% or at least about 50% of the area along a side of the cage is open to the cage interior to permit airflow through the side of the cage. In other words, one or more sidewalls are open to the cage interior and define an open area along the side of the cage that is at least about 10%, such as at least about 15%, at least about 20%, at least about 30%, at least about 40%, or at least about 50% of the area defined by the length or width dimension and the height dimension of the cage (e.g., in the embodiment of FIGS. 3A and 3B, each side is completely open such that an open area along each side of the cage is 100% of the area defined by the length or width dimension and the height dimension of the cage along such side). In addition, apertures can also be provided in the top and/or bottom walls to allow for airflow through these walls for entry into and exit from the cage interior.

Figure 6A:
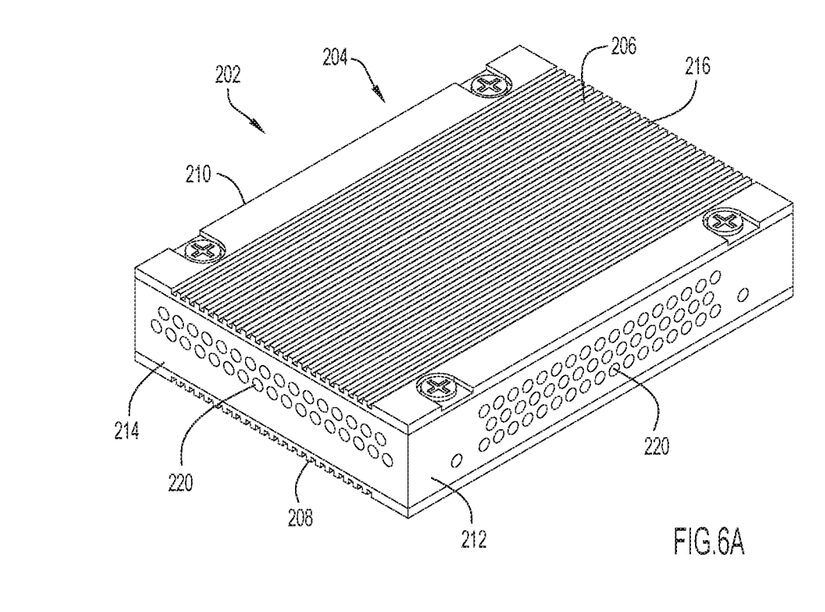
FIGS. 6A and 6B depict a further example embodiment of a SSD device including a cage which provided enhanced thermal management for the integrated circuit components of the SSD device in accordance with the present invention.
Figure 6B:
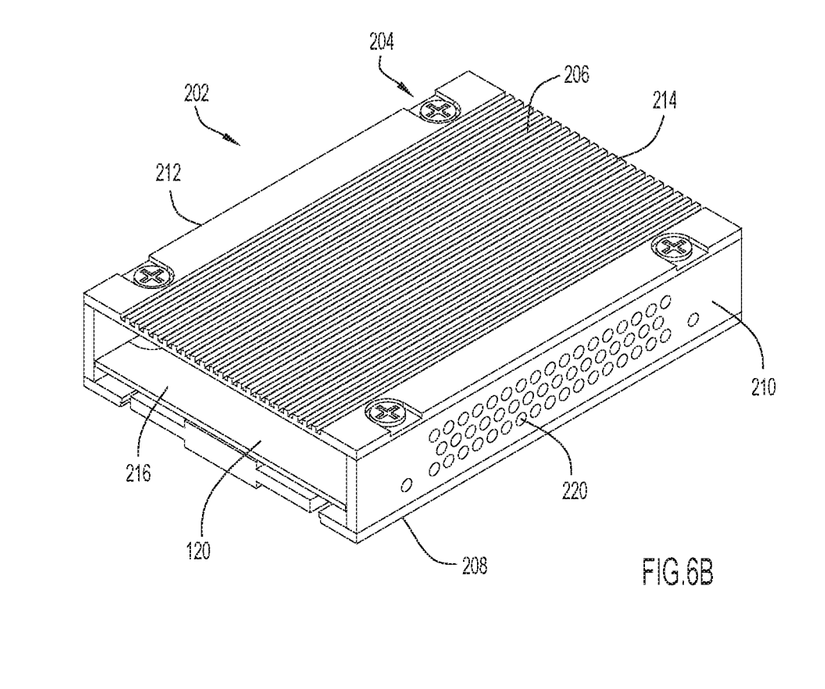

Referring to FIGS. 6A and 6B, another embodiment of a SSD device is depicted. In this embodiment, the SSD device 202 includes an SSD cage 204 including a top wall 206 and a bottom wall 208 separated a suitable distance to define a cage interior between the top and bottom walls (where the cage interior provides at least a partially enclosed space for a PCB 120). Each of the top and bottom walls 206, 208 can include fins on their exterior surfaces (e.g., a similar configuration as the fins 110 for first and second walls or plates 106, 108 as depicted in FIG. 4). The cage 204 also includes sidewalls 210, 212 which extend the length of the SSD device 202 and between top and bottom walls 206, 208. A front sidewall 214 is also provided at the front end of the cage 204 (and front end of the SSD device 202), while the rear end 216 of the cage 204 is free of any sidewall such that this rear side of the cage is entirely open to permit airflow into and out of the cage interior (as defined between top, bottom and side walls). In addition, the front sidewall 214 and the other sidewalls 210, 212 include openings or apertures 220 that extend through the sidewalls to permit airflow into and out of the cage interior. The apertures in the sidewalls and the absence of the rear end wall in the cage enhances airflow and thermal regulation of the SSD device.

Figure 7A:
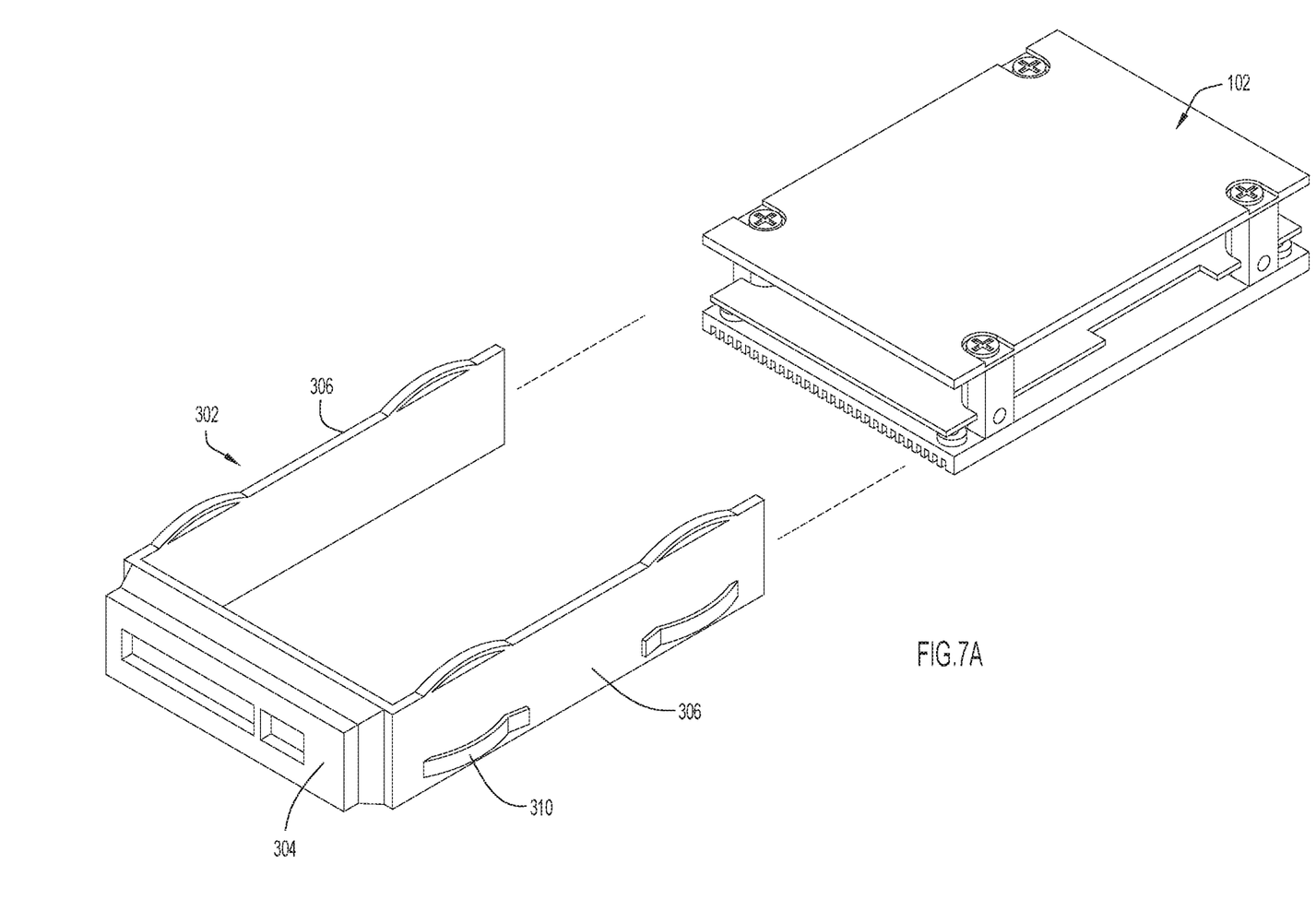
FIGS. 7A and 7B depict an example embodiment of a drive bracket that connects with the SSD device of FIG. 3A to facilitate easy insertion and removal of the SSD device from a server.
Figure 7B:
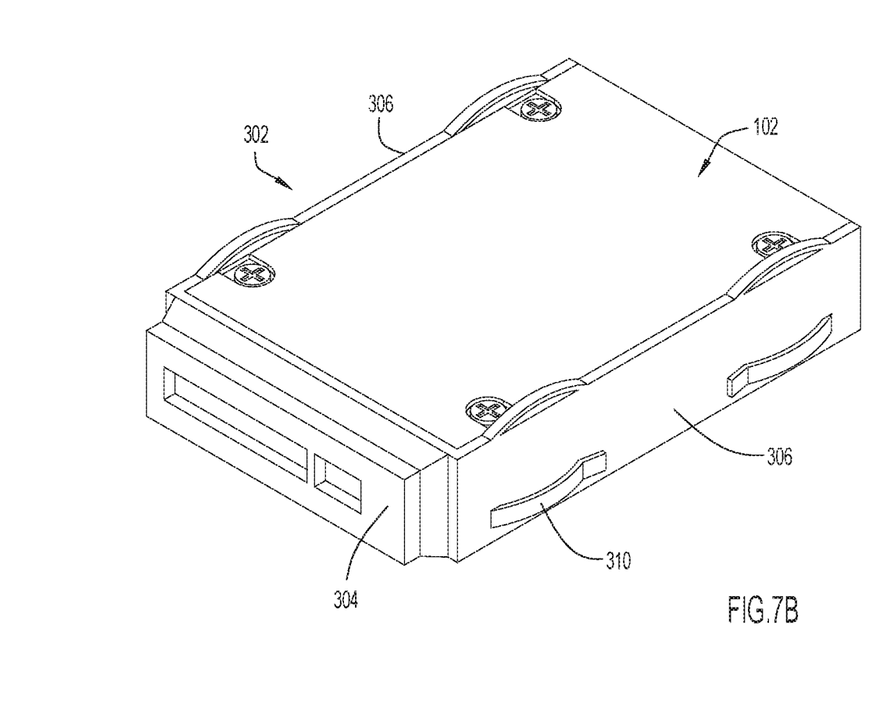

Since the SSD devices described herein have the same or similar dimensions as conventional SSD devices and thus meet standard SSD specifications for use with different types of servers, the SSD devices can also be coupled with any conventional or other types of accessory components. For example, an SSD device can include a U-shaped bracket that connects with the cage of the SSD device so as to extend along lengthwise sides of the cage and an end that extends a width of the cage. Referring to FIGS. 7A and 7B, a bracket 302 (e.g., a commercially available or any other suitable type of bracket suitable for use with a conventional SSD device) can be combined with an SSD device 102 to facilitate easy insertion and removal of the SSD device 102 within a slot of a server (e.g., server 40). The bracket 302 has a general U-shape and includes a front end section 304 and two side arm sections 306 that extend from the ends of the front end section. At least one side arm section 306 can include a latch 310 that frictionally engages with the cage 104 to releasably connect the latch with the SSD device 102.

The embodiments of a SSD device described herein enhance the thermal performance of the SSD device by providing the free flow of air through the SSD cage and around integrated circuit components that can increase in temperature during use. By removing portions of the cage along the sidewalls (e.g., by providing apertures in the sidewalls and/or removing one or more sidewalls altogether), the ability of air to enter and flow through the cage and provide a cooling effect to the integrated circuit components of the PCB is enhanced. The further combination of cage materials used (e.g., copper or aluminum) and fins along one or more exterior surfaces of the cage also enhances the thermal regulation of the circuit components within the SSD cage.

Thus, an example embodiment of a solid state drive (SSD) device as described herein comprises a cage comprising a top wall and a bottom wall spaced a distance from the top wall so as to define a cage interior between the top and bottom walls, wherein at least 10% of an area along a side of the cage is open to the cage interior to permit airflow through the side of the cage, and at least one printed circuit board (PCB) provided within the cage interior, wherein the PCB includes one or more integrated circuit components.

An example embodiment of a server system as described herein comprises a server comprising a processor enclosed within a housing, and a plurality of interface ports to connect with external hardware components, and a solid state drive (SSD) device connectable with an interface port of the server. The SSD device comprises a cage comprising a top wall and a bottom wall spaced a distance from the top wall so as to define a cage interior between the top and bottom walls, wherein at least 10% of an area along a side of the cage is open to the cage interior to permit airflow through the side of the cage, and at least one printed circuit board (PCB) provided within the cage interior, wherein the PCB includes one or more integrated circuit components.

An example embodiment of a cage for a solid state drive (SSD) device as described herein comprises a top wall and a bottom wall spaced a distance from the top wall so as to define a cage interior between the top and bottom walls, wherein at least 10% of an area along a side of the cage is open to the cage interior to permit airflow through the side of the cage. The cage interior is dimensioned to receive and retain at least one printed circuit board (PCB) that includes one or more integrated circuit components.

The above description is intended by way of example only. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A solid state drive (SSD) device comprising:
   a cage comprising a metallic top wall and a metallic bottom wall spaced a distance from the top wall so as to define a cage interior between the top and bottom walls, and a plurality of pillars that connect the top wall with the bottom wall, wherein the cage is free of any sidewall extending between the top and bottom walls such that the cage is open to the cage interior to permit airflow through the cage; and
   at least one printed circuit board (PCB) provided within the cage interior, wherein the PCB includes a plurality of integrated circuit components and a plurality of thermal interface material (TIM) pads disposed between the integrated circuit components and a top or bottom wall of the cage so as to transfer heat between the integrated circuit components and the cage, and at least one pillar of the plurality of pillars that connects the top wall with the bottom wall is external to an outer periphery of the PCB.

2. The SSD device of claim 1, wherein each pillar of the plurality of pillars is external to an outer periphery of the PCB.

3. The SSD device of claim 2, wherein each pillar is located at a lengthwise end of the cage.

4. The SSD device of claim 1, wherein fins are disposed on an exterior surface of at least one of the top wall and the bottom wall.

5. The SSD device of claim 1, further comprising a plurality of PCBs provided within the cage interior.

6. The SSD device of claim 1, further comprising a U-shaped bracket that connects with the cage so as to extend along lengthwise sides of the cage and an end that extends a width of the cage.

7. A server system comprising:
   a server comprising a processor enclosed within a housing, and a plurality of interface ports to connect with external hardware components; and
   the solid state drive (SSD) device of claim 1, wherein the SSD device is coupled to a printed circuit board of the server and is further connectable with an interface port of the server.

8. The server system of claim 7, further comprising a plurality of PCBs provided within the cage interior.

* * * * *